US012677639B2

(12) United States Patent (10) Patent No.: US 12,677,639 B2
Parkhe (45) Date of Patent: Jul. 7, 2026

(54) SUBSTRATE SUPPORT ASSEMBLIES HAVING INTERNAL SHAFT AREAS WITH ISOLATED ENVIRONMENTS THAT MITIGATE OXIDATION

(71) Applicant: Applied Materials, Inc., Santa Clara, CA (US)

(72) Inventor: Vijay D. Parkhe, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 619 days.

(21) Appl. No.: 17/954,423

(22) Filed: Sep. 28, 2022

(65) Prior Publication Data

US 2023/0113486 A1 Apr. 13, 2023

Related U.S. Application Data

(60) Provisional application No. 63/254,809, filed on Oct. 12, 2021.

(51) Int. Cl.
*H10P 72/76* (2026.01)
*H10P 72/00* (2026.01)
*H10P 72/72* (2026.01)

(52) U.S. Cl.
CPC ...... *H10P 72/7626* (2026.01); *H10P 72/0432* (2026.01); *H10P 72/0604* (2026.01); *H10P 72/72* (2026.01)

(58) Field of Classification Search
CPC ......... H01L 21/68792; H01L 21/67103; H01L 21/67253; H01L 21/6831
See application file for complete search history.

(56) References Cited

U.S. PATENT DOCUMENTS

| | | | |
|---|---|---|---|
| 2002/0094591 A1 | 7/2002 | Sill et al. | |
| 2005/0274324 A1* | 12/2005 | Takahashi | H01L 21/6831 |
| | | | 118/723 E |
| 2010/0136773 A1* | 6/2010 | Akae | C23C 16/4408 |
| | | | 257/E21.478 |
| 2010/0184290 A1 | 7/2010 | Kim | |
| 2012/0091108 A1 | 4/2012 | Lin et al. | |
| 2013/0081702 A1 | 4/2013 | Mohammed | |
| 2014/0165915 A1* | 6/2014 | Raj | H01L 21/68792 |
| | | | 219/544 |

(Continued)

FOREIGN PATENT DOCUMENTS

| | | |
|---|---|---|
| JP | H10189490 A | 7/1998 |
| JP | H11214489 A | 8/1999 |
| JP | 2000188321 A | 7/2000 |

(Continued)

OTHER PUBLICATIONS

KR 20120019620 A translation (Year: 2012).*

(Continued)

*Primary Examiner* — Sunil K Singh
*Assistant Examiner* — Eric Daniel Whitmire
(74) *Attorney, Agent, or Firm* — Lowenstein Sandler LLP

(57) ABSTRACT

A substrate support assembly includes a shaft body, a plate attached to an upper portion of the shaft body, and a plug or cap attached to a lower portion of the shaft body. The shaft body, the plate and the plug or cap define an internal shaft area having an isolated environment. The internal shaft area is a vacuum environment or comprises an inert gas.

20 Claims, 4 Drawing Sheets

(56)          References Cited

U.S. PATENT DOCUMENTS

2019/0203350 A1*   7/2019   Khaja  .................. F02B 75/045

FOREIGN PATENT DOCUMENTS

| | | | | | |
|---|---|---|---|---|---|
| JP | 2002526915 | A | | 8/2002 | |
| JP | 2003133242 | A | | 5/2003 | |
| JP | 2007002298 | A | | 1/2007 | |
| JP | 2007332465 | A | | 12/2007 | |
| JP | 2009076598 | A | | 4/2009 | |
| JP | 4450106 | B1 | | 4/2010 | |
| JP | 2010232419 | A | | 10/2010 | |
| JP | 2011525694 | A | | 9/2011 | |
| KR | 20110014104 | A | | 2/2011 | |
| KR | 20120019320 | A | | 3/2012 | |
| KR | 20120019620 | A | * | 3/2012 | ....... H01L 21/68742 |
| KR | 1020120019620 | A | | 3/2012 | |
| KR | 20140097312 | A | | 8/2014 | |
| KR | 20160004201 | A | | 1/2016 | |
| KR | 1020190119386 | A | | 10/2019 | |
| WO | 2020160497 | A1 | | 8/2020 | |

OTHER PUBLICATIONS

PCT Notification of Transmittal of the International Search Report and the Written Opinion of the International Searching Authority for PCT Application No. PCT/US/2022/046313, mailed Feb. 9, 2023, 10 pages.

* cited by examiner

200

200

400

SUBSTRATE SUPPORT ASSEMBLIES HAVING INTERNAL SHAFT AREAS WITH ISOLATED ENVIRONMENTS THAT MITIGATE OXIDATION

RELATED APPLICATION

This application claims the benefit of U.S. Provisional Application 63/254,809, filed on Oct. 12, 2021 and entitled "SUBSTRATE SUPPORT ASSEMBLIES HAVING INTERNAL SHAFT AREAS WITH ISOLATED ENVIRONMENTS THAT MITIGATE OXIDATION", the entire contents of which are incorporated by reference herein.

TECHNICAL FIELD

Embodiments of the present invention relate, in general, to substrate processing, and in particular, to substrate support assemblies having isolated internal shaft areas that mitigate oxidation.

BACKGROUND

An electronic device manufacturing apparatus can include multiple chambers, such as process chambers and load lock chambers. Such an electronic device manufacturing apparatus can employ a robot apparatus in the transfer chamber that is configured to transport substrates between the multiple chambers. In some instances, multiple substrates are transferred together. Process chambers may be used in an electronic device manufacturing apparatus to perform one or more processes on substrates, such as deposition processes and etch processes.

SUMMARY

In some embodiments, a substrate support assembly is provided. The substrate support assembly includes a shaft body, a plate attached to an upper portion of the shaft body, and a plug or cap attached to a lower portion of the shaft body. The shaft body, the plate and the plug or cap define an internal shaft area having an isolated environment. The internal shaft area is a vacuum environment.

In some embodiments, a substrate support assembly is provided. The substrate support assembly includes a shaft body, a plate attached to an upper portion of the shaft body, and a plug or cap attached to a lower portion of the shaft body. The shaft body, the plate and the plug or cap define an internal shaft area having an isolated environment. The internal shaft area comprises an inert gas.

In some embodiments, a processing chamber is provided. The processing chamber includes a substrate support assembly. The substrate support assembly includes a shaft body, a plate attached to an upper portion of the shaft body, and a plug or cap attached to a lower portion of the shaft body. The shaft body, the plate and the plug or cap define an internal shaft area having an isolated environment. The internal shaft area is a vacuum environment.

Numerous other aspects and features are provided in accordance with these and other embodiments of the disclosure. Other features and aspects of embodiments of the disclosure will become more fully apparent from the following detailed description, the claims, and the accompanying drawings.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
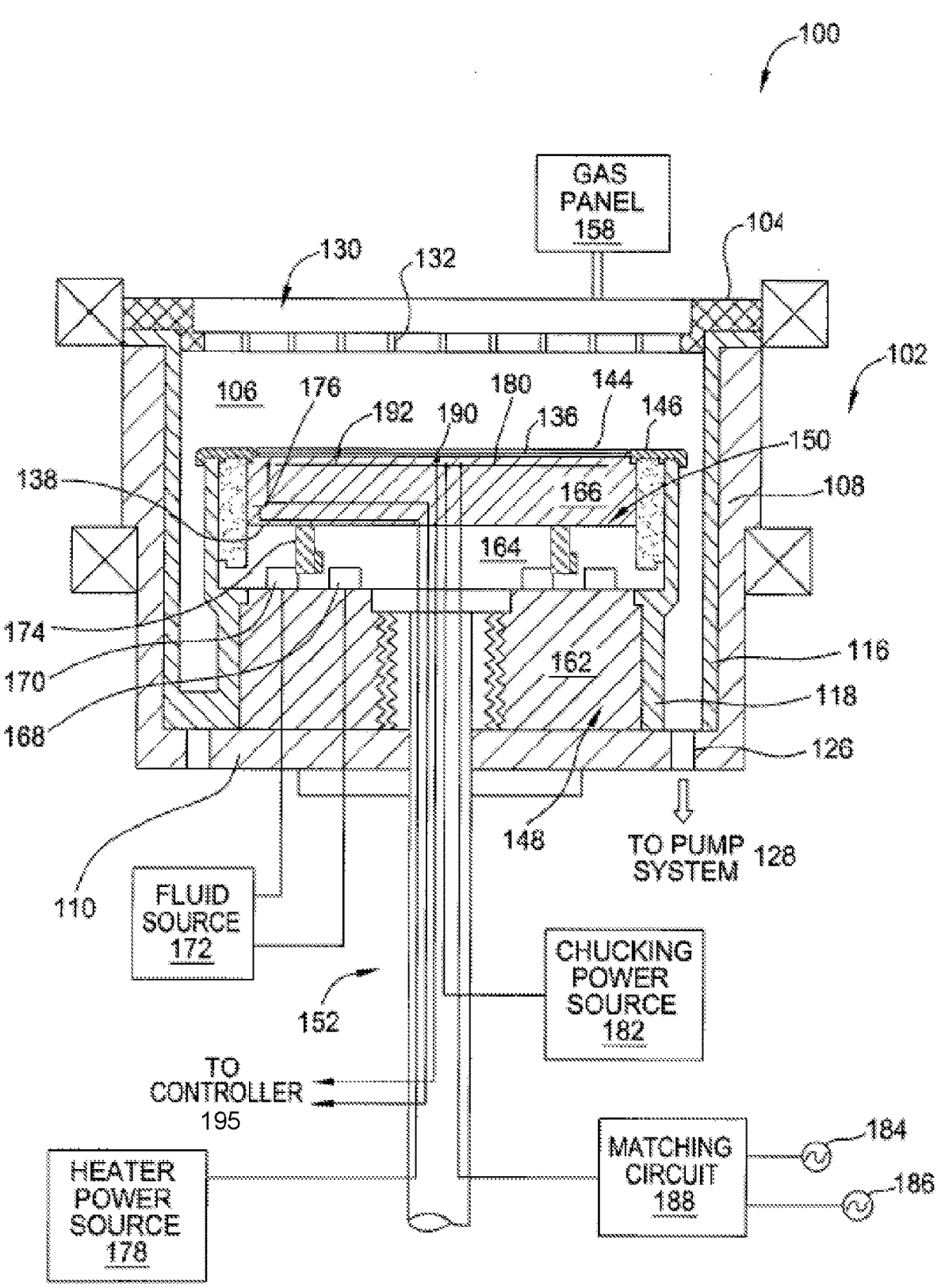
FIG. 1 depicts a cross-sectional view of one embodiment of a processing chamber.

Described herein are embodiments of chucks (e.g., electrostatic chucks) and heaters having internal shaft areas with isolated environments. The isolated environments of the internal shaft areas for the chucks and/or heaters are maintained at vacuum or filled with inert gas to prevent oxidation and/or plate deformation.

Substrate support assemblies, such as chucks (e.g., electrostatic chucks) and heaters used in process chambers (e.g., deposition chambers, etch chambers, etc.) generally have a shaft at a bottom of the chuck or heater. Traditionally, an interior surface of the shaft is exposed to air. Exposure of the internal surface of the shaft to air (e.g., oxygen) causes at least portions of the shaft to become oxidized over time. Additionally, heaters and chucks are often heated during processing, causing a length of the shaft to change. This can at least be partially attributed to the temperature gradient and/or pressure gradient inside of the internal shaft area and/or between the internal shaft area and the outer environment surrounding the shaft. For example, a temperature differential may exist in the internal shaft area, in which the top of the internal shaft area has a higher temperature than the bottom of the internal shaft area, and a pressure differential may exist between the internal shaft area and the outer environment. Moreover, plate deformation (e.g., expansion, bowing and/or stretching of a plate such as a heater plate) can occur due to the environment conditions within the process chamber (e.g., high temperature and/or pressure conditions) as a result of long-term exposure to high levels of stress that are still below the yield strength of the material. Plate deformation can be more severe in materials that are subjected to heat for long periods, particularly as materials approach their melting point and soften. For example, plates made from metal materials such as aluminum (Al) can be particularly vulnerable to deformation due to pressure differentials at temperatures exceeding 350° C.

To address at least the above-noted drawbacks, embodiments described herein provide for substrate support assemblies, such as electrostatic chucks or heaters, having internal shaft areas that have an isolated environment. The isolated environment is either maintained at a vacuum or filled with an inert gas. By maintaining the isolated environment of the inside of the shaft at vacuum or filling it with inert gas, oxidation of the interior of the shaft and/or plate deformation of the interior of the shaft can be prevented or mitigated. For example, with respect to a heater having a plate made from a material that can be subject to deformation (e.g., Al plate), the internal shaft area can be maintained at vacuum conditions to reduce or eliminate plate deformation and oxidation (e.g., braze oxidation) within the internal shaft area, at least because vacuums are poor thermal conductors and the lack of air prevents oxidation from occurring within the internal shaft area. As another example, with respect to an electrostatic chuck having a plate made from a material that may not be sensitive to deformation (e.g., a ceramic material), an inert gas can be maintained in the internal shaft area to reduce or eliminate oxidation within the internal shaft area.

FIG. 1 is a cross-sectional view of one embodiment of a processing chamber 100 having a substrate support assembly 148 disposed therein. The processing chamber 100 includes a chamber body 102 and a lid 104 that enclose an interior volume 106. The chamber body 102 may be fabricated from aluminum, stainless steel or other suitable material. The chamber body 102 generally includes sidewalls 108 and a bottom 110. An outer liner 116 may be disposed adjacent the sidewalls 108 to protect the chamber body 102. The outer liner 116 may be fabricated and/or coated with a plasma or halogen-containing gas resistant material. In one embodiment, the outer liner 116 is fabricated from aluminum oxide. In another embodiment, the outer liner 116 is fabricated from or coated with yttria, yttrium alloy or an oxide thereof.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The lid 104 may be supported on the sidewall 108 of the chamber body 102. The lid 104 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through a gas distribution assembly 130 that is part of the lid 104. Examples of processing gases may be used to process in the processing chamber including halogen-containing gas, such as $C_2F_6$, $SF_6$, $SiCl_4$, HBr, $NF_3$, $CF_4$, $CHF_3$, $CH_2F_3$, $Cl_2$ and $SiF_4$, among others, and other gases such as $O_2$, or $N_2O$. Examples of carrier gases include $N_2$, He, Ar, and other gases inert to process gases (e.g., non-reactive gases). The gas distribution assembly 130 may have multiple apertures 132 on the downstream surface of the gas distribution assembly 130 to direct the gas flow to the surface of the substrate 144. Additionally, the gas distribution assembly 130 can have a center hole where gases are fed through a ceramic gas nozzle. The gas distribution assembly 130 may be fabricated and/or coated by a ceramic material, such as silicon carbide, yttria, etc. to provide resistance to halogen-containing chemistries to prevent the gas distribution assembly 130 from corrosion.

The substrate support assembly 148 is disposed in the interior volume 106 of the processing chamber 100 below the gas distribution assembly 130. The substrate support assembly 148 holds the substrate 144 during processing. An inner liner 118 may be coated on the periphery of the substrate support assembly 148. The inner liner 118 may be a halogen-containing gas resist material such as those discussed with reference to the outer liner 116. In one embodiment, the inner liner 118 may be fabricated from the same materials of the outer liner 116.

In one embodiment, the substrate support assembly 148 includes a mounting plate 162 supporting a shaft 152 connected to an electrostatic chuck 150. The electrostatic chuck 150 may or may not include a thermally conductive base 164 bonded to a ceramic body (referred to as an electrostatic puck 166 or ceramic puck) via a bond 138. The electrostatic puck 166 may be fabricated by a ceramic material such as aluminum nitride (AlN) or aluminum oxide ($Al_2O_3$). A mounting plate 162 may be coupled to the bottom 110 of the chamber body 102, and may include passages for routing utilities (e.g., fluids, power lines, sensor leads, etc.) to the thermally conductive base 164 and the electrostatic puck 166. In one embodiment, the mounting plate 162 includes a plastic plate, a facilities plate and/or a cathode base plate.

The thermally conductive base 164 and/or electrostatic puck 166 may include one or more optional embedded heating elements 176, embedded thermal isolators 174 and/or conduits 168, 170 to control a lateral temperature profile of the substrate support assembly 148. The thermal isolators 174 (also referred to as thermal breaks) extend from an upper surface of the thermally conductive base 164 towards the lower surface of the thermally conductive base 164, as shown. The conduits 168, 170 may be fluidly coupled to a fluid source 172 that circulates a temperature regulating fluid through the conduits 168, 170.

The embedded thermal isolator 174 may be disposed between the conduits 168, 170 in one embodiment. The heater 176 is regulated by a heater power source 178. The conduits 168, 170 and heater 176 may be utilized to control the temperature of the thermally conductive base 164, thereby heating and/or cooling the electrostatic puck 166 and a substrate (e.g., a wafer) being processed. The temperature of the electrostatic puck 166 and the thermally conductive base 164 may be monitored using a plurality of temperature sensors 190, 192, which may be monitored using a controller 195.

The electrostatic puck 166 may further include multiple gas passages such as grooves, mesas and other surface features, which may be formed in an upper surface of the electrostatic puck 166. The gas passages may be fluidly coupled to a source of a thermally conductive gas, such as He via holes drilled in the puck 166. In operation, the gas may be provided at controlled pressure into the gas passages to enhance the heat transfer between the electrostatic puck 166 and the substrate 144.

The electrostatic puck 166 includes at least one clamping electrode 180 controlled by a chucking power source 182. The clamping electrode 180 (or other electrode disposed in the electrostatic puck 166 or the thermally conductive base 164) may further be coupled to one or more RF power sources 184, 186 through a matching circuit 188 for maintaining a plasma formed from process and/or other gases within the processing chamber 100. The sources 184, 186 are generally capable of producing RF signal having a frequency from about 50 kHz to about 3 GHz and a power of up to about 10,000 Watts.

The shaft 152 may be bonded to the electrostatic chuck 150 by a bond, braze or weld. One or more cables (e.g., for connecting to embedded heating elements 176, temperature sensors 190, 192, clamping electrode 180, etc.) may run through the interior of the shaft 152, as shown. An interior of the shaft 152, also referred to as an internal shaft area, has an isolated environment maintained during and/or between process runs performed by the process chamber 100. In some embodiments, the isolated environment is a vacuum environment. In some embodiments, the isolated environment includes one or more inert gases. For example, the one or more inert gases can include an inert gas mixture. The vacuum environment or inert gas(es) may prevent the interior of the shaft 152 (e.g., such as an exposed braze within the interior of the shaft 152) from becoming oxidized and/or may prevent the interior of the shaft 152 and/or the electrostatic chuck 150 from becoming deformed, as discussed in greater detail below.

Figure 2A:
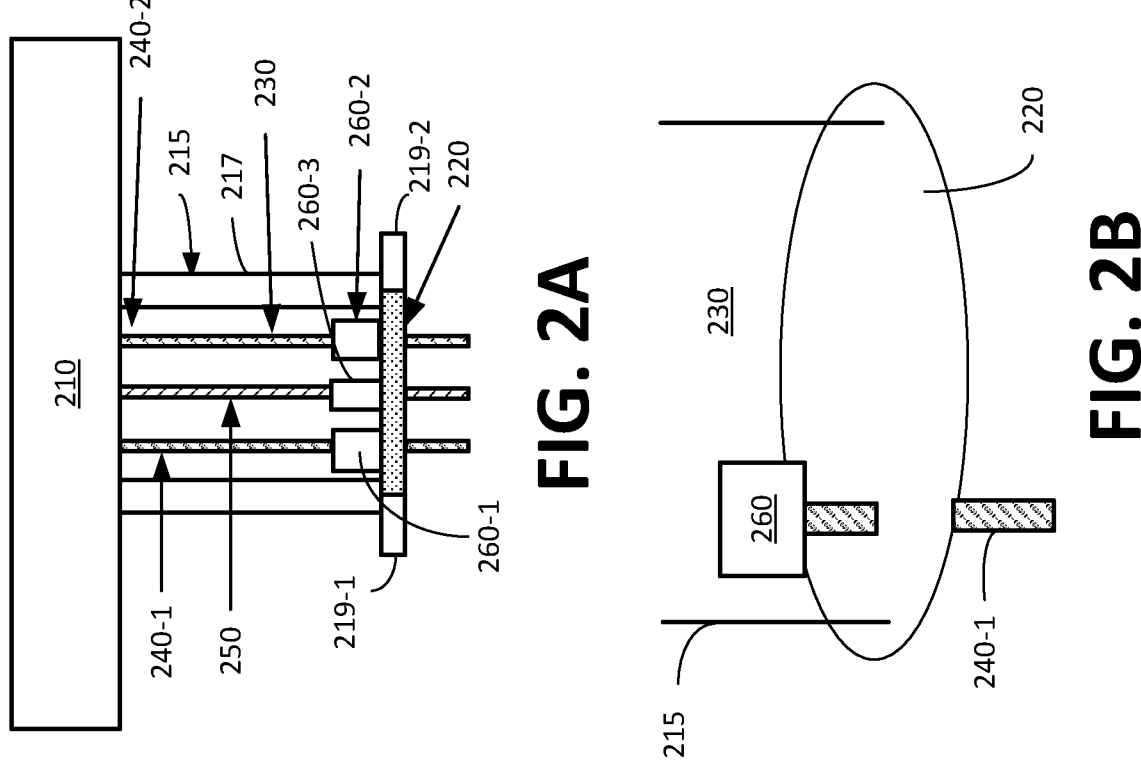
FIGS. 2A and 2B depict views of a substrate support assembly for use within a processing chamber, in accordance with some embodiments.
Figure 2B:
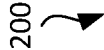

FIG. 2A depicts a cross-sectional view of a substrate support assembly 200 for use within a processing chamber, in accordance with some embodiments. FIG. 2B depicts a perspective view of a bottom portion of the substrate support assembly 200 (not showing a plate). For example, the substrate support assembly 200 may be used in processing chamber 100 of FIG. 1. In some embodiments, the substrate support assembly 200 includes a heater. In some embodiments, the substrate support assembly 200 includes an electrostatic chuck, which may include one or more embedded heating elements.

As shown, the substrate support assembly 200 includes a plate 210. The plate 210 is configured to receive a substrate or wafer. For example, the plate 210 can have a circular shape as viewed from a top-down perspective for receiving a circular substrate. The plate 210 can include an embedded heater. The plate 210 can be formed from any suitable material in accordance with the embodiments described herein. In some embodiments, the plate 210 includes a metal material. For example, the plate 210 can include or consist of aluminum (Al) or Al alloy. In some embodiments, the plate 210 includes a ceramic material. For example, the plate 210 can include or consist of aluminum nitride (e.g., AN), aluminum oxide (e.g., $Al_2O_3$), and/or another ceramic. In some embodiments, the plate 210 is a heater plate that includes one or more heater electrodes of a heater. In such an embodiment, the plate 210 may be a metal plate, such as an aluminum plate. In one embodiment, the heater plate is one large heater electrode. In some embodiments, the plate 210 is a ceramic plate of a chuck such as an electrostatic chuck. In such an embodiment, the plate 210 may include one or more chucking electrodes, one or more RF electrodes for maintaining an RF field for plasma processes, and/or one or more heater electrodes.

The plate 210 is attached a shaft body 215. More specifically, the plate 210 can be welded or brazed shaft body 215 (e.g., to legs or sidewalls 217 of the shaft body 215). In embodiments, the shaft body 215 (e.g., the legs or sidewalls 217 of the shaft body 215) can be welded or brazed to a flange (which may form base portions 219 of the shaft body 215). For example, the shaft body 215 can have a circular shape as viewed from a top-down perspective. The shaft body 215 can be formed from any suitable material. For example, the shaft body 215 can be formed from a metal material (e.g., Al or an Al alloy).

A bottom of shaft body 215 is in contact with a plug 220 formed between the sidewalls or legs 217 of the shaft body 215 and the base portions 219 of the shaft body 215. Alternatively, a cap may be formed over the sidewalls or legs 217 of the shaft body 215. The plug 220 (or cap) can be brazed or welded to the legs or sidewalls 217 of the shaft body 215. In one embodiment, the plug 220 (or cap) is bonded (e.g., brazed or welded) to the base portions 219. The plate 210, the shaft body 215 and the plug 220 (or cap) collectively form an internal shaft area 230 that has its own isolated environment. As will be described in further detail below, the plug 220 or cap separates the internal shaft area 230 from the surrounding atmosphere, causing the internal shaft area 230 to be an isolated environment.

Within the internal shaft area 230, a number of electrical connectors 240-1 and 240-2 and/or a thermal couple 250 may be attached to the plate 210 and formed through the plug 220 or cap. The electrical connectors 240-1, 240-2 and/or thermal couple 250 may connect to electrodes within the plate 210 in embodiments. The electrical connectors 240-1 and 240-2 may provide power to the plate 210 (e.g., the embedded heater) and/or to electrodes within the plate 210. The thermal couple 250 may enable a feedback loop for measuring the temperature of the plate 210 in order to control the temperature of the plate 210. The electrical connectors 240-1 and 240-2 can be formed from conductive (e.g., metal) rods or tubes, which can be encapsulated by an insulating material (e.g., ceramic material). The electrical connectors 240-1 and 240-2 and the thermal couple 250 can each be formed from a solid or non-hollow rod or tube. The electrical connectors 240-1 and 240-2 and the thermal couple 240 can be brazed to the plate 210 using a suitable braze material (e.g., braze alloy).

At least one of the electrical connectors 240-1 and 240-2 and/or the thermal couple 250 can be formed to have a flexible connection to enable an adjustable length. As further shown within the internal shaft area 230, a number of connections 260-1 through 260-3 are provided each corresponding to a respective one of the electrical connectors 240-1 and 240-2 and the thermal couple 250. For example, the connections 260-1 through 260-3 can be spring-like objects that receive the electrical connectors 240-1 and 240-2 and the thermal couple 250, and expand and contract with respect to the motion of the substrate support assembly 200. In some embodiments, the connections 260-1 through 260-3 are multilam connections.

During operation of the substrate support assembly 200, the operating temperature may be very high (e.g., exceeding 400° C.). In the event that the plate 210 is formed from a material that is susceptible to deformation under such higher temperatures (e.g., a metal such as Al), the pressure differential and/or temperature differential within the internal shaft area 230 and/or between the internal shaft area 230 and an exterior shaft area and/or an interior of a process chamber that includes substrate support assembly 200 can cause the plate 210 to deform. To address this scenario, the internal shaft area 230 can be maintained in a sufficiently low pressure environment, referred to as a vacuum environment, to prevent deformation of the plate 210 during operation. The pressure of the internal shaft area 230 may be maintained at the same or similar pressure as that maintained within a process chamber in which the substrate support assembly 200 is installed. This may mitigate a pressure different between the internal shaft area and the interior of the process chamber. For example, as will be described in further detail below with reference to FIG. 3, the substrate support assembly 200 can be operatively coupled to a vacuum pump for maintaining a vacuum within the internal shaft area 230. The plug 220 or cap may include a channel or pumping port that is coupled to a vacuum pump via a conduit. Through the pumping port, the vacuum pump may pump down the internal shaft area 230 to a target pressure (e.g., a target vacuum pressure). Alternatively, the internal shaft area 230 may be hermetically sealed by the plug 220 or cap, and may have been pumped down to vacuum or near vacuum pressure levels prior to the hermetic sealing. In some embodiments, the pressure within the internal shaft area 230 can be from about 0 millitorr (mTorr) to about 3 mTorr.

Additionally, during operation of the substrate support assembly 200, the effects of oxidation due to the presence of atmospheric gases within the internal shaft area 230 can corrode one or more components within the internal shaft area 230. For example, braze oxidation can occur with respect to the braze connections used to connect the electrical connectors 240-1 and 240-2 and/or the thermal couple 250 to the plate 210. Maintaining the internal shaft area 230 at the sufficiently low pressure environment (e.g., vacuum environment) described above can further prevent oxidation by removing a substantial volume of atmospheric gases from the internal shaft area 230, preventing interaction of those gases with the braze on the internal shaft area 230.

Alternatively, instead of maintaining a sufficiently low pressure environment within the internal shaft area 230, the internal shaft area 230 can be filled with at least one inert gas that will not corrode the braze connections over time. For example, the at least one inert gas can be an inert gas mixture including multiple inert gases. More specifically, the inert gas can be a gas that lacks oxygen and/or a halogen. Examples of inert gases include nitrogen ($N_2$), noble gases such as argon (Ar), neon (Ne), krypton (Kr), xenon (Xe), radon (Rn), etc. The use of an inert gas or inert gas mixture instead of maintaining a sufficiently low pressure environment, may be particularly useful in situations where plate deformation is not a concern, such as lower temperature environments or for plate materials that are not subject to deformation at high temperatures (e.g., if the plate 210 is formed from a ceramic material). In some embodiments, the internal shaft area 230 is backfilled with the inert gas mixture after creating the low pressure or vacuum environment within the internal shaft area 230 (e.g., after vacuum pumping).

The plug 220 (or cap) can be formed to seal off the internal shaft area 230 to prevent atmospheric gases from entering the internal shaft area 230 and/or the inert gas mixture from exiting the internal shaft area 230. Additionally, through holes corresponding to the formation of the electrical connectors 240-1 and 240-2 and the thermal couple 250 through the plug 220 (or cap) are sealed off to prevent atmospheric gases from entering the internal shaft area 230 and/or the inert gas mixture from exiting the internal shaft area 230. For example, the internal shaft area 230 can be manufactured to include a permanent vacuum.

Figure 3:
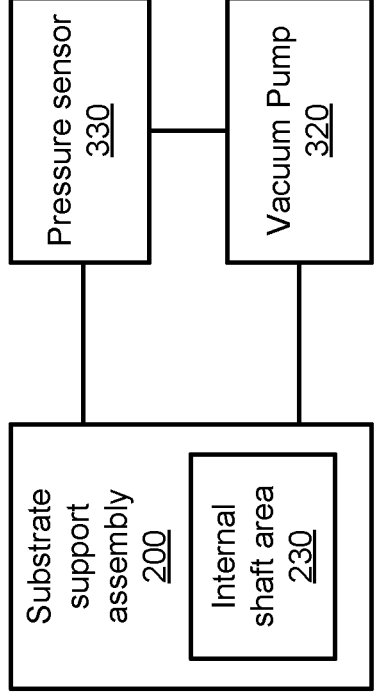
FIG. 3 depicts a block diagram of a system for maintaining a vacuum, in accordance with some embodiments.

FIG. 3 is a system 300 for maintaining a vacuum, in accordance with some embodiments. As shown, the system 300 includes the substrate support assembly 200 having the internal shaft area 230 of FIG. 2. As further shown, the system includes a vacuum pump 320. The vacuum pump 320 can include a hose coupled to a pumping port of the substrate support assembly 200 to maintain a sufficiently low pressure environment within the internal shaft area 230. In some embodiments, as further shown, the system 300 can further include a pressure sensor 330 operatively coupled to the substrate support assembly 200 and the vacuum pump 320. The pressure sensor 330 can obtain a pressure measurement within the internal shaft area 230, determine whether the pressure measurement exceeds a threshold pressure measurement, and trigger the vacuum pump to pump air out of the internal shaft area 230 in response to determining that the pressure measurement exceeds the threshold pressure measurement. The threshold pressure measurement can be selected as a maximum allowable pressure for preventing oxidation and/or plate deformation. In some embodiments, the threshold pressure measurement is selected in a range from about 0 mTorr to about 3 mTorr. For example, the threshold pressure measurement can be 1 mTorr, such that the vacuum will be triggered (e.g., switched on) in response to the pressure sensor 330 determining that the measurement exceeds 1 mTorr.

Figure 4:
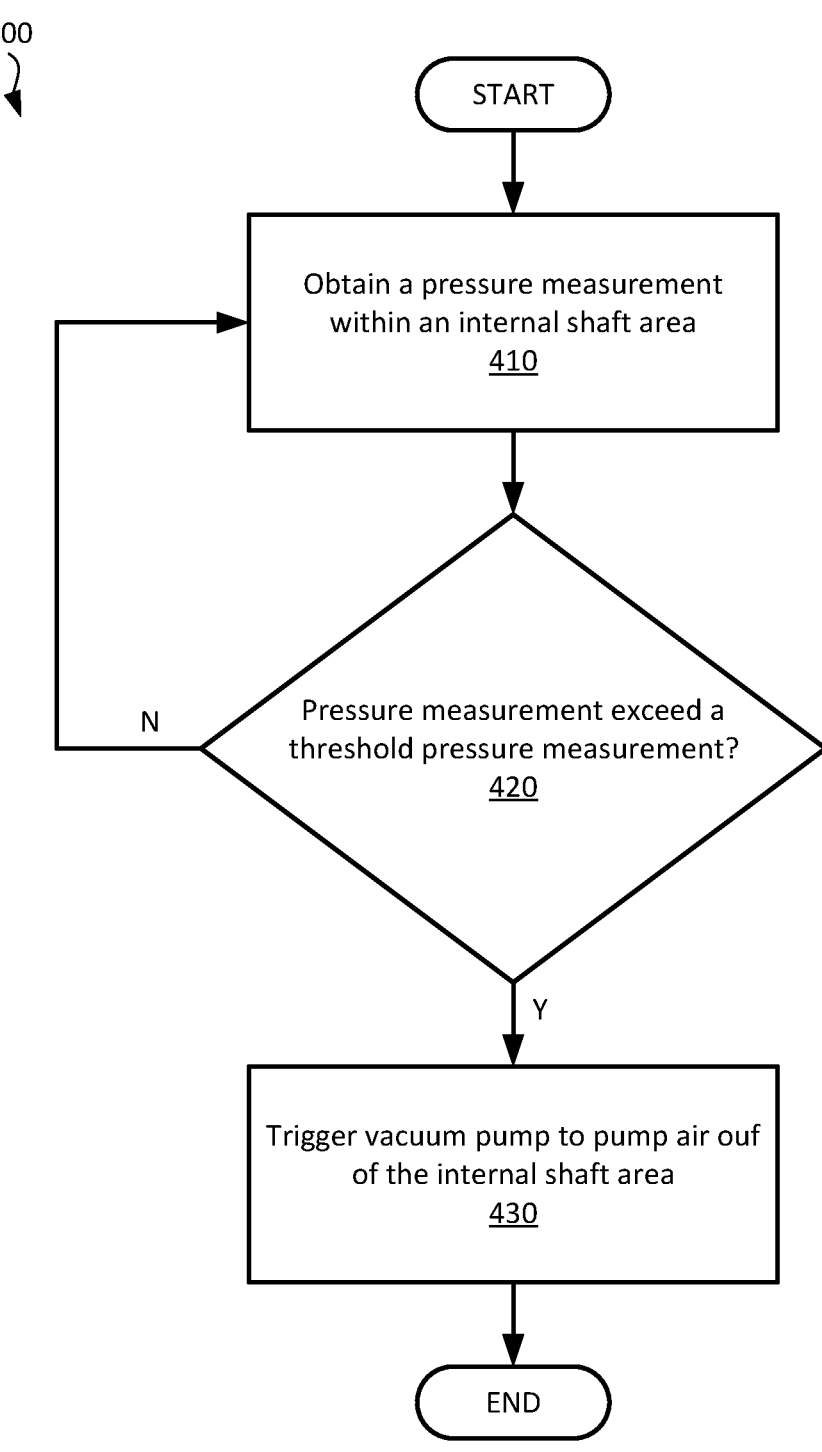
FIG. 4 depicts a flow chart of an example method for maintaining a vacuum, in accordance with some embodiments.

FIG. 4 depicts a flow chart of an example method 400 for maintaining a vacuum, in accordance with some embodiments. For example, the method 400 can be performed by a pressure sensor, such as the pressure sensor 330 described above with reference to FIG. 3.

At block 410, a pressure measurement within an internal shaft area is obtained. More specifically, the pressure within the internal shaft area can be monitored by the pressure sensor to obtain the pressure measurement.

At block 420, it is determined whether the pressure measurement exceeds a threshold pressure measurement. The threshold pressure measurement can be selected as a maximum allowable pressure for preventing oxidation and/or plate deformation. In some embodiments, the threshold pressure measurement is selected in a range from about 0 mTorr to about 3 mTorr. For example, the threshold pressure measurement can be 1 mTorr.

If the pressure measurement does not exceed the threshold pressure measurement (e.g., the pressure measurement is less than or equal to the threshold pressure measurement), this means that the pressure measurement does not exceed the maximum allowable pressure for preventing oxidation and/or plate deformation. Thus, the process can revert back to block 410 to continue monitoring the pressure within the internal shaft area.

Otherwise, if the pressure measurement exceeds the threshold pressure measurement (e.g., the pressure measurement is greater than the threshold pressure measurement), this means that there is a risk of oxidation and/or plate deformation. To reduce the pressure within the internal shaft area, at block 430, a vacuum pump can be triggered to pump air out of the internal shaft area. The vacuum pump can include a hose coupled to a pumping port of a substrate support assembly to maintain a sufficiently low pressure environment within the internal shaft area. More specifically, the vacuum pump can reduce the pressure of the internal shaft area to a target pressure (e.g., a target vacuum pressure). After the pressure in the internal shaft area is reduced, the pressure monitoring process can restart at block 410.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±25%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A substrate support assembly comprising:
a shaft body;
a plate attached to an upper portion of the shaft body;
a plug or cap brazed or welded to a lower portion of the shaft body;
at least one component coupled to the plate and formed through the plug or cap; and
at least one flexible connection that receives the at least one component;
wherein the at least one flexible connection is a spring-like object that enables an adjustable length by expanding or contracting with respect to motion of the substrate support assembly;
wherein the shaft body, the plate and the plug or cap define an internal shaft area having an isolated environment; and
wherein the isolated environment is a vacuum environment.

2. The substrate support assembly of claim 1, wherein the plate is an electrostatic chuck.

3. The substrate support assembly of claim 1, wherein the plate is a heater plate.

4. The substrate support assembly of claim 1, wherein the plate comprises at least one of a metal material or a ceramic material.

5. The substrate support assembly of claim 1, wherein the at least one component comprises:
an electrical connector brazed to the plate; and
a thermal couple brazed to the plate; and
wherein the isolated environment reduces braze oxidation.

6. The substrate support assembly of claim 1, wherein the internal shaft area is hermetically sealed to maintain the vacuum environment.

7. The substrate support assembly of claim 1, wherein the internal shaft area is configured to be connected to a vacuum pump to maintain the vacuum environment.

8. A substrate support assembly comprising:
a shaft body;
a plate attached to an upper portion of the shaft body;
a plug or cap brazed or welded to a lower portion of the shaft body;
at least one component coupled to the plate and formed through the plug or cap; and
at least one flexible connection that receives the at least one component;
wherein the at least one flexible connection is a spring-like object that enables an adjustable length by expanding or contracting with respect to motion of the substrate support assembly; and
wherein the shaft body, the plate and the plug or cap define an internal shaft area having an isolated environment.

9. The substrate support assembly of claim 8, wherein the plate is an electrostatic chuck.

10. The substrate support assembly of claim 8, wherein the plate is a heater plate.

11. The substrate support assembly of claim 8, wherein the plate comprises at least one of a metal material or a ceramic material.

12. The substrate support assembly of claim 8, wherein the internal shaft area is hermetically sealed.

13. The substrate support assembly of claim 8, wherein the at least one component comprises:
an electrical connector brazed to the plate; and
a thermal couple brazed to the plate; and
wherein the isolated environment reduces braze oxidation.

14. The substrate support assembly of claim 13, further comprising:
a first connection within the internal shaft area connected to the electrical connector; and
a second connection within the internal shaft area connected to the thermal couple.

15. A processing chamber comprising:
a substrate support assembly, the substrate support assembly comprising:
a shaft body;
a plate attached to an upper portion of the shaft body;
a plug or cap brazed or welded to a lower portion of the shaft body;
at least one component coupled to the plate and formed through the plug or cap; and
at least one flexible connection that receives the at least one component;
wherein the at least one flexible connection is a spring-like object that enables an adjustable length by expanding or contracting with respect to motion of the substrate support assembly;
wherein the shaft body, the plate and the plug or cap define an internal shaft area having an isolated environment; and
wherein the isolated environment is a vacuum environment.

16. The processing chamber of claim 15, wherein the plate is an electrostatic chuck.

17. The processing chamber of claim 15, wherein the plate comprises at least one of a metal material or a ceramic material.

18. The processing chamber of claim 15, wherein the at least one component comprises:
an electrical connector brazed to the plate; and
a thermal couple brazed to the plate; and
wherein the isolated environment reduces braze oxidation.

19. The processing chamber of claim 15, wherein the internal shaft area is hermetically sealed to maintain the vacuum environment.

20. The processing chamber of claim 15, further comprising:
a vacuum pump operatively coupled to the substrate support assembly; and
a pressure sensor operatively coupled to the vacuum pump and the substrate support assembly, wherein the pressure sensor is to:
obtain a pressure measurement within the internal shaft area;
determine whether the pressure measurement exceeds a threshold pressure measurement; and in response to determining that the pressure measurement exceeds the threshold pressure measurement, trigger the vacuum pump to pump air out of the internal shaft area.

*   *   *   *   *